(12) United States Patent
Eggert et al.

(10) Patent No.: US 11,370,422 B2
(45) Date of Patent: Jun. 28, 2022

(54) METHOD AND SYSTEM IN A VEHICLE FOR IMPROVING PREDICTION RESULTS OF AN ADVANTAGEOUS DRIVER ASSISTANT SYSTEM

(71) Applicant: HONDA RESEARCH INSTITUTE EUROPE GMBH, Offenbach/Main (DE)

(72) Inventors: Julian Eggert, Offenbach (DE); Andreas Richter, Offenbach (DE); Florian Damerow, Uelversheim (DE)

(73) Assignee: HONDA RESEARCH INSTITUTE EUROPE GMBH, Offenbach/Main (DE)

( * ) Notice: Subject to any disclaimer, the term of this patent is extended or adjusted under 35 U.S.C. 154(b) by 32 days.

(21) Appl. No.: 15/040,276

(22) Filed: Feb. 10, 2016

(65) Prior Publication Data
US 2016/0236683 A1   Aug. 18, 2016

(30) Foreign Application Priority Data

Feb. 12, 2015   (EP) .................................... 15154924

(51) Int. Cl.
*B60W 30/095* (2012.01)
*G01C 21/20* (2006.01)
(Continued)

(52) U.S. Cl.
CPC .......... *B60W 30/095* (2013.01); *G01C 21/20* (2013.01); *G01C 21/30* (2013.01); *G01S 13/86* (2013.01);
(Continued)

(58) Field of Classification Search
None
See application file for complete search history.

(56) References Cited

U.S. PATENT DOCUMENTS 5,801,970 A * 9/1998 Rowland ............... G01S 3/7865
                                                                 342/63
8,588,471 B2 * 11/2013 Hsieh ................. G06K 9/00201
                                                                 382/106
(Continued)

FOREIGN PATENT DOCUMENTS

DE   102016223422 A1 * 5/2018 ............. G06K 9/627
WO   WO-2009030520 A1 * 3/2009 ........... G09B 29/106
WO   2011/160672 A1   12/2011

OTHER PUBLICATIONS

H. Durrant-Whyte and T. Bailey, "Simultaneous localization and mapping: part I," in IEEE Robotics & Automation Magazine, vol. 13, No. 2, pp. 99-110, Jun. 2006, doi: 10.1109/MRA.2006.1638022. (Year: 2006).*

(Continued)

*Primary Examiner* — Peter D Nolan
*Assistant Examiner* — Michael F Whalen
(74) *Attorney, Agent, or Firm* — Squire Patton Boggs (US) LLP

(57) ABSTRACT

A method for improving prediction results of advanced driver assistance systems of a vehicle includes obtaining map data including information about a road geometry in a proximity of the vehicle. A sensor means is assigned, sensing a surrounding of the vehicle. A virtual sensing means output is generated, corresponding to an output of the sensing means if the sensing means. The generation is based on a mathematical model of the sensing means. The surrounding of the vehicle is sensed, and a sensing means output is generated. The sensing means output is compared to the virtual sensing means output. Parameters of the mathematical model are modified, and the virtual sensing means output are generated and compared to the sensing means output. Map data is combined with information (Continued)

derived from the sensing means output to generate combined information, which is output for further processing.

8 Claims, 3 Drawing Sheets

(51) Int. Cl.
| | | |
|---|---|---|
| G01C 21/30 | (2006.01) | |
| G01S 13/86 | (2006.01) | |
| G01S 13/931 | (2020.01) | |
| G06F 30/20 | (2020.01) | |
| G06V 20/10 | (2022.01) | |
| G06V 20/56 | (2022.01) | |
| G06F 17/10 | (2006.01) | |
| G08G 1/16 | (2006.01) | |
| G01S 17/89 | (2020.01) | |
| G01S 13/89 | (2006.01) | |

(52) U.S. Cl.
CPC ............ *G01S 13/931* (2013.01); *G06F 17/10* (2013.01); *G06F 30/20* (2020.01); *G06V 20/10* (2022.01); *G06V 20/56* (2022.01); *G08G 1/165* (2013.01); *G08G 1/166* (2013.01); *G01S 13/89* (2013.01); *G01S 17/89* (2013.01); *G01S 2013/932* (2020.01); *G01S 2013/9322* (2020.01); *G01S 2013/9323* (2020.01); *G01S 2013/93271* (2020.01)

(56) References Cited

U.S. PATENT DOCUMENTS

| | | | | |
|---|---|---|---|---|
| 9,402,151 | B2* | 7/2016 | Song | G05D 1/0253 |
| 9,921,067 | B2* | 3/2018 | Fanselow | G01C 25/00 |
| 10,742,969 | B1* | 8/2020 | Rohatgi | G06T 7/20 |
| 10,785,474 | B1* | 9/2020 | Semansky | G01S 7/4972 |
| 10,937,178 | B1* | 3/2021 | Srinivasan | G06T 7/50 |
| 10,984,543 | B1* | 4/2021 | Srinivasan | G06T 7/70 |
| 2002/0169537 | A1* | 11/2002 | Regensburger | G01S 13/931 |
| | | | | 701/96 |
| 2008/0056535 | A1* | 3/2008 | Bergmann | G01C 21/30 |
| | | | | 382/103 |
| 2009/0228204 | A1* | 9/2009 | Zavoli | G01S 19/49 |
| | | | | 701/532 |
| 2010/0253596 | A1* | 10/2010 | Szczerba | G01S 13/723 |
| | | | | 345/7 |
| 2011/0054791 | A1* | 3/2011 | Surampudi | G01C 21/005 |
| | | | | 701/472 |
| 2011/0224902 | A1* | 9/2011 | Oi | G06F 16/51 |
| | | | | 701/300 |
| 2014/0309841 | A1 | 10/2014 | Hara et al. | |
| 2014/0333473 | A1* | 11/2014 | Steinbuch | G01S 7/4026 |
| | | | | 342/174 |
| 2014/0347486 | A1* | 11/2014 | Okouneva | G06T 7/0004 |
| | | | | 348/148 |
| 2015/0115571 | A1* | 4/2015 | Zhang | H04N 7/183 |
| | | | | 280/477 |
| 2015/0117723 | A1* | 4/2015 | Joshi | G01C 21/20 |
| | | | | 382/113 |
| 2015/0172626 | A1* | 6/2015 | Martini | G06T 7/0008 |
| | | | | 348/50 |
| 2015/0332098 | A1* | 11/2015 | Wang | G06K 9/3241 |
| | | | | 382/103 |
| 2015/0341629 | A1* | 11/2015 | Zeng | G06T 7/80 |
| | | | | 348/187 |
| 2016/0070981 | A1* | 3/2016 | Sasaki | B60R 1/00 |
| | | | | 348/148 |
| 2016/0209846 | A1* | 7/2016 | Eustice | G05D 1/0246 |
| 2016/0223649 | A1* | 8/2016 | Schwindt | G01S 7/4026 |
| 2016/0238481 | A1* | 8/2016 | Brandon | G01M 9/08 |
| 2016/0349061 | A1* | 12/2016 | Fanselow | G01C 21/206 |
| 2016/0353099 | A1* | 12/2016 | Thomson | H04N 17/002 |
| 2017/0046833 | A1* | 2/2017 | Lurie | G06T 5/008 |
| 2017/0106750 | A1* | 4/2017 | Tauchi | B60R 1/00 |
| 2017/0255199 | A1* | 9/2017 | Boehmke | G01C 21/34 |
| 2018/0033310 | A1* | 2/2018 | Kentley-Klay | G06K 9/00805 |
| 2018/0040141 | A1* | 2/2018 | Guerreiro | G06T 7/80 |
| 2018/0067494 | A1* | 3/2018 | Schiffmann | G01S 17/89 |
| 2018/0172860 | A1* | 6/2018 | Wilson | G01V 1/50 |
| 2018/0321378 | A1* | 11/2018 | Sudhakar | G01S 13/343 |
| 2018/0370436 | A1* | 12/2018 | Hussler | B60R 1/00 |
| 2019/0087772 | A1* | 3/2019 | Medina | G06Q 30/016 |
| 2019/0096081 | A1* | 3/2019 | Gupta | G06T 7/70 |
| 2019/0155302 | A1* | 5/2019 | Lukierski | G06T 17/00 |
| 2019/0311546 | A1* | 10/2019 | Tay | G06T 19/006 |
| 2019/0369234 | A1* | 12/2019 | Wetoschkin | G01S 13/931 |
| 2020/0011969 | A1* | 1/2020 | Noro | G01S 15/86 |
| 2020/0202559 | A1* | 6/2020 | Cramblitt | G01C 21/005 |
| 2020/0239010 | A1* | 7/2020 | Corghi | G01S 7/4026 |
| 2020/0410702 | A1* | 12/2020 | Zhang | G01S 17/931 |
| 2021/0019897 | A1* | 1/2021 | Biswas | G06K 9/00798 |
| 2021/0064877 | A1* | 3/2021 | Ramasamy | G06Q 30/0645 |
| 2021/0174579 | A1* | 6/2021 | Wakimoto | G06T 7/73 |

OTHER PUBLICATIONS

Norman Mattern et al., "High-Accurate Vehicle Localization Using Digital Maps and Coherency Images", 2010 IEEE Intelligent Vehicles Symposium, University of California, San Diego, CA USA Jun. 21-24, 2010, pp. 462-469.

European Search Report application No. 16155195.7 dated Jun. 23, 2016.

* cited by examiner

METHOD AND SYSTEM IN A VEHICLE FOR IMPROVING PREDICTION RESULTS OF AN ADVANTAGEOUS DRIVER ASSISTANT SYSTEM

BACKGROUND

Field

The invention relates to advanced driver assistant systems which assist a driver in driving a vehicle on which the system is mounted.

Description of the Related Art

In recent years, systems have been developed that increase the comfort and safety when driving a vehicle. Due to the increasing density of traffic and also due to increased expectations of vehicle drivers regarding comfort of their vehicles, systems that assist a driver in driving the vehicle have been developed. Starting from simple systems like cruise control systems that maintain a target speed set by the driver of the vehicle, such systems have been further developed. The latest developments regard in particular the evaluation of the traffic scene that is perceived by sensing means that are mounted on the vehicle. Based on such observed traffic scenes, situations are determined and information is output to the driver which assists a driver in taking decisions. Such information may be a warning symbol to inform a driver for example of another vehicle which might have been overseen by the driver or the system may even autonomously interact with controls of the vehicle. Such interaction may for example include acceleration of the vehicle, deceleration of the vehicle or even correction of a driving direction. Intelligent adaptive driving assistant systems (ADAS) or assisted, semi-automated or autonomous driving need information about a current position of the vehicle (ego-vehicle) relative to the scene infrastructure. Such infrastructure in particular comprises the roads, lanes, traffic signs and so on. But also the current position and driving direction of other traffic participants needs to be taken into consideration. Starting from this information, a prediction is made regarding the paths the vehicles will follow. An example might be a crossing or intersection for which a planned ego-vehicle trajectory is evaluated regarding the risk of this particular trajectory while taking into consideration trajectories that are predicted for other traffic participants. For such evaluation it is important to know precisely on which lanes for example of a multi-lane road the other traffic participants as well as the ego-vehicle are driving. Also the relative position of all traffic participants to traffic lights, traffic signs and also relative to each other are of great importance.

At the moment, the capability of the systems to determine the position of the ego-vehicle and/or the other traffic objects relative to each other or any infrastructure element of a traffic scene is limited.

In most cases, the basis for obtaining information about a traffic scene is based on sensing means, such as cameras, laser scanners, LIDAR sensors or radar sensors that record information about the surrounding of the ego-vehicle equipped with the adaptive driving assistant system. For many evaluation tasks on the other side it is necessary to know the geometry of a road, number of lanes, type of the lanes and so on. Such information can be obtained from map data that is for example stored in a navigation system also mounted on the ego-vehicle. One problem now is that the information that is obtained from the sensing means mounted on the ego-vehicle and information that is derived from the map data do not necessarily match very well, because of a positioning error. Thus, it is necessary to match the position of information derived from the sensing means and from map data in order to have combined information which may then be the basis for further processing in an advanced driver assistant system. Of course, it would be possible to use map data that already has precise information about geometry, shape, width and so on of any road that is included in the map data. Together with position estimation of high quality, this would also lead to the desired result i.e. an alignment of the map and information from the sensor(s). In such a case, the data derived from the sensing means output and the map data can be combined directly. But this would require highly accurate map data compilations and also high quality positioning estimation systems. It is evident that this high quality of map data and high quality of positioning estimation systems is rather expensive and thus an alternative solution is needed. Furthermore, it cannot be guaranteed that map data having such a high accuracy is available at all. For example, map data may be taken from public sources or commercial sources. But these map data are optimized for routing functions only and therefore do not provide enough information for a precise geometrical reconstruction of a scene. Such map data usually includes information about a rough geometrical path and maybe also about the number and direction of lanes and the road type. But for routing tasks it is not important if the absolute position of the road in the map is correct or not.

On the other side, there are technologies known in the art that generate models of the surrounding of a vehicle on the basis of the sensed surrounding of the vehicle by means of a camera while simultaneously recording the trajectory of the camera on the vehicle. This is known as "self-localization and mapping". It is also known to estimate three dimensional structures from two dimensional image sequences when the motion of the camera device generating the two dimensional images is known. This information allows to reconstruct a three dimensional scene, but of course this has the disadvantage that the information about the three dimensional scene is available only for future driving because during a first drive the data has to be generated and recorded. But still the information that is obtained from the self-localization and mapping and the generation of three dimensional structures from the motion of the camera is independent from map information that is already available.

It is furthermore known in the art that an image is rendered from map data, wherein the image corresponds to an image that would have been taken by a camera mounted on the vehicle. But such rendering of a virtual three dimensional image is based on an assumption of the virtual camera located at a particular position on such map. Again, the problem remains that the information from the map and the information derived from a real camera device are not aligned and therefore may hardly be a common basis for prediction of trajectories of traffic participants.

SUMMARY

The object of the present invention is therefore to enable to align and combine information that is derived from map data with information that is derived from a sensing means mounted on the ego-vehicle.

The problem is solved by the method and system according to the present invention.

The present invention is a method and system for improving prediction results of an advanced driver assistant system that is mounted on a vehicle. The method uses an obtaining means of the system that is configured to obtain map data that includes information about at least a geometry and position of an item such as a road or infrastructure element in the proximity of the vehicle. Such proximity may be defined by the sensor range of a sensing means that is also mounted on the ego-vehicle. The sensor means is assigned a position and orientation in the map. Such assigning of a position and orientation may be performed for example on the basis of data from a positioning system, like GPS that provides an absolute position of the vehicle, and a mathematical model for the sensor means including a parameterization of the position in the map. It reflects thus the current assumed position of the sensing means in the map that was obtained.

Based on the map data and the mathematical model of the sensing means a virtual sensing means output is generated. The mathematical model of the sensing means describes the relative position of the sensing means to the position estimated for example by the GPS, but also characteristics of the sensing means itself. In case of a camera this could be for example the aperture, the sensing range, the focal length and so on. The virtual sensing means output is an output that corresponds to an output of the sensing means if the sensing means sensed the scene defined by the information included in the map data from the position and orientation that was assigned to the sensing means. Techniques for generating such virtual sensing means output as such are known in the art and thus do not need to be described here in detail. Thus, a first, virtual sensor means output is generated which is obtained not by in fact physically sensing the environment of the ego-vehicle but which is a simulation of sensing of the environment based on information derived from the map data.

In addition a second output is generated which is the output of the real sensing means that is mounted in the ego-vehicle that senses the surrounding of the vehicle.

The first and the second output are then compared with each other. The parameters of the mathematical model on which the generation of the virtual sensing means output is based are then modified, if a degree of fit between the virtual sensor output and the sensor output is below a predetermined threshold. This modification is repeatedly performed until a predetermined degree of fit between the two outputs is achieved. Using the parameters that are the result of this optimization process allows to align information derived from the sensing means output and map data so that the information can be combined with map data in order to generate the combined information of the surrounding of the vehicle. This combined information is then output for further processing in an advanced driver system. For example the combination can include the data that may be derived directly from the map data but also information like the width of the road, position of target objects, positions of infrastructure elements like traffic signs or the like that are determined from the sensing means output. Since by modifying the parameters until a predetermined degree of fit is achieved the information from the sensing means output is aligned with the information of the map data which means corrected regarding their relative position. It is to be noted that this does not necessarily mean that the absolute position is in fact correct but relative to the information derived from the map data the information about positions of objects or infrastructure elements derived from the sensor means output is correct. This is then the basis for further processing in an advanced driver assistance system in which for example trajectories of other traffic participants are predicted or risk estimation for a planned trajectory of the ego-vehicle is performed.

The sub claims define the advantageous aspects of the invention.

It is for example preferred that the sensing means comprises an image sensor and that a three dimensional rendering image is generated as virtual sensing means output. This has on the one side the advantage that relatively simple sensing means like cameras, stereo cameras and the like may be used and on the other side well known and established in the art three dimensional rendering techniques can be used. Thus, implementation of the invention may be achieved easily.

Alternatively the sensing means output is generated by a laser scanner, a LIDAR sensor or a radar sensor which are already used in advanced driver assistance systems and again the effort necessary for further developing the systems is limited.

Furthermore, it is advantageous that the ego-vehicle comprises a e.g. satellite-based localization system (e.g. like GPS, Galileo or GLONASS) for determining a position of the vehicle and that the mathematical model of the sensing means includes parameters that describe relative position and orientation of the sensing means to the vehicle. Thus, the position in the map that is assigned the sensing means can be determined in two steps which is at first determining the position of the vehicle with aid of the GPS and then determining the position of the sensor means using the mathematical model. This approach furthermore has the advantage that a position estimation of the vehicle based on the GPS system does not need to be changed at all but the alignment between the map and the information derived from the sensing means output can be performed by only modifying the parameters of the mathematical model. Thus, errors that are the result of the GPS system with limited accuracy can be compensated for by the modification of the parameters of the mathematical model.

On the other side it is also possible that the position of the vehicle in the map is determined taking into account the mathematical model with the modified parameters for which the predetermined degree of fit is achieved. By doing so at first the position of the sensing means in the map is determined and for the parameters which have been obtained by the optimization process which means the modification until a predetermined degree of fit is achieved, are then used to determine the position of the vehicle, thus using information on a relative position of the sensing means in the vehicle. Thus, the GPS is used only for a first assumption of the position of the vehicle and the sensing means mounted on the vehicle and then after the comparison of the first and second output and optimizing the parameters of the mathematical model, the position of the vehicle in the map is determined using information of the mathematical model with the optimized parameters so that the position of the vehicle in the map is determined relative to the position determined for the sensing means.

According to another aspect the vehicle may be equipped with the plurality of sensing means and for each of the individual sensing means a respective mathematical model exists. Thus, the modification of the parameters of each of the mathematical models is performed individually which means that for each of the sensors a virtual sensing means output is generated and the parameters of the mathematical models are modified until a predetermined degree of fit is achieved. For each of the sensing means an individual threshold may be set. Then the combination of map data with the information derived from the sensing means is also performed for all of the individual sensing means. Thus, the map data is enhanced by information that is derived from a plurality of sensing means wherein all of this information can be combined with a map at correct relative positions to other map elements.

If such plurality of sensing means is available it is also advantageous to determine the position of the vehicle in the map taking into account all the mathematical models of the different sensor devices.

As it has been indicated above it is in particular advantageous that infrastructure elements or the like that can be determined from the sensor output of the real sensing means are added to the map data. In particular this addition of information in the map data shall be stored so that in future situations where map data of a respective area is used includes this added information already. This is in particular an advantage for information that may not change over time like for example lane boundaries, traffic signs, traffic lights, buildings and the like.

Another advantage is that from the comparison of the virtual sensing means output after a predetermined degree of fit has been achieved it can be evaluated from the sensing means output positions of possible occluders in the sensed scenes. In order to determine such possible occluders it is determined which areas of the sensing means output are compatible with the road structure assumed from the map data. Thus, those areas that are not compatible can be assumed to form occluders because here in the sensing means output obviously the corresponding area of the virtual sensing means output could not be perceived.

BRIEF DESCRIPTION OF THE DRAWINGS

An embodiment of the present invention will be explained now with respect to the annexed drawings.

DETAILED DESCRIPTION

Figure 1:
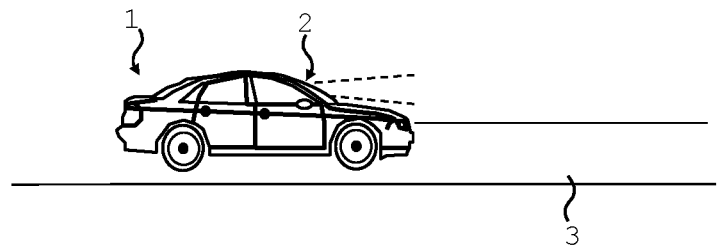
FIG. 1 shows a simplified illustration with an ego-vehicle on which a sensing means is mounted.

In FIG. 1 there is shown an ego-vehicle 1 on which the inventive system is mounted. The vehicle 1 is equipped with an advanced driver assistant system or another system for assisted, semi-autonomous or autonomous driving functions. The vehicle 1 is equipped with sensing means 2 which for example may be a stereo camera, LIDAR sensor, laser scanner, radar sensor or the like. The information derived from the sensing shall be aligned with map data that may also be obtained by the vehicle 1. The sensing means 2 physically senses vehicle surroundings, in the illustrated embodiment, in particular the road ahead of the vehicle 3. Thus, in an image that is obtained from the sensing means output, corner and curvature, road boundaries, lanes, lane markings, a junction or an intersection geometry is visible. But also other road infrastructure in the proximity of the ego-vehicle can be sensed by the sensing means. The actual position of the sensing means 2 relative to the ego-vehicle 1 is known and the position of the sensing means in the map is defined by a mathematical model of the sensing means 2 that furthermore includes information about characteristics of the sensing means 2 such as an aperture of a camera or the like. In addition the orientation of the sensing means 2 relative to the orientation of the vehicle 1 is also defined in the parameters of the mathematical model.

Figure 2:
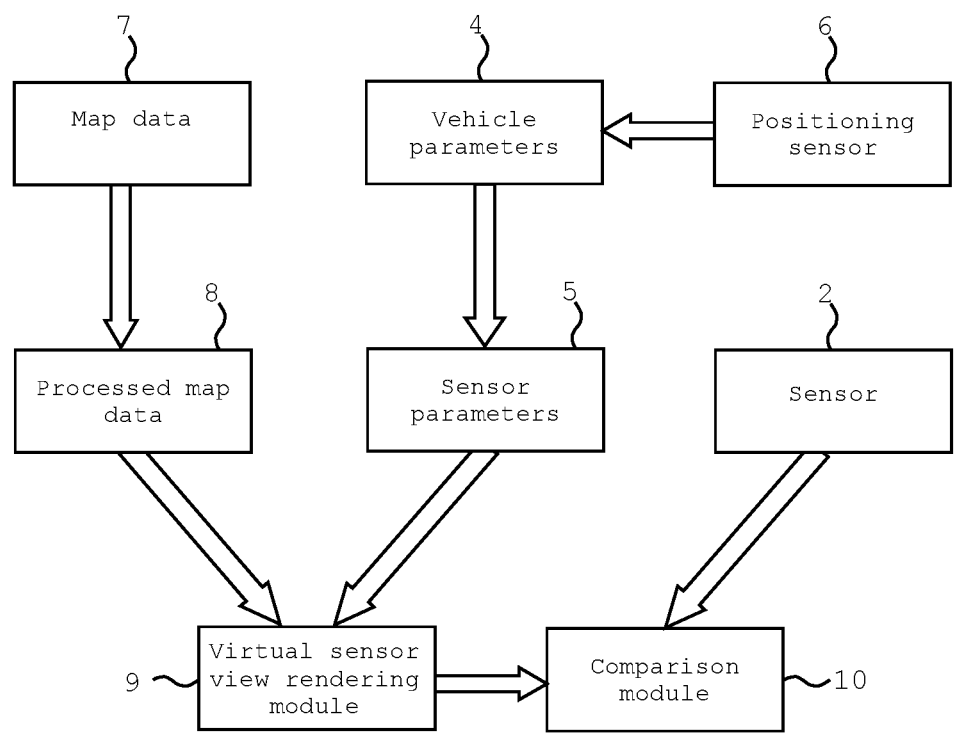
FIG. 2 shows a block diagram of the system according to the invention.

In FIG. 2 there are shown the functional blocks of the system, according to the invention, and the interaction of the different functional blocks. The mathematical model that has already been described with respect to FIG. 1 is included in the first module that comprises at least a storage means for storing the model and the model parameters. Furthermore, the first module has information about the position and orientation of the vehicle 1. In the illustrated embodiment, a global positioning system sensor 6 is present which supplies information about the estimated absolute position of the vehicle 1 to the first module 4. A second module 5 stores information about the relative position, orientation and specifications of the sensor which are defined by parameters of the mathematical model. In case that the sensing means 2 comprises a plurality of sensor devices, this information is stored individually for each of the sensor devices. Thus each sensor is described by an individual mathematical model.

The vehicle 1 further comprises a map data obtaining means 7 which is capable of accessing map data. These map data may be derived from a navigation system that is also included in the vehicle 1. But alternatively, it is of course also possible to retrieve map data from a distant data base online. In that case it is preferred that only data that corresponds approximately to the range that may be sensed by the sensing means 2 is retrieved. Map data contains a description of the road infrastructure in the proximity of the vehicle 1. Such road infrastructure may for example be a geometry, a road path, delimiters, normal lanes, bicycle and pedestrian lanes, junctions, intersections and so on.

For the present invention it is necessary that the map data includes information not only about a road path line, but also additional information like width, lanes and delimiters. In case that the map data that is obtained does not include such additional information, it is necessary to have a map data enhancement module 8 which processes the map data in order to generate the information necessary for the alignment that is performed afterwards.

Such additional information may for example be calculated from connecting paths between different lines, directly from the geometrical information of the map data, but also using information of additional geometrical information services, traffic regulation data and the like. The enhancement of map data can also be performed offline so that this additional information is already included in the map data of a map data obtaining unit 7 or can be added during performing the method according to the invention in a map processing unit 8. The map data which is then used for the further processing according to the inventive method preferably contains information about the road geometry including road surface with a certain width, lanes and delimiters, height and inclination data. Of course not all of this information is necessary.

The enhanced map data is then used in a virtual sensor rendering module 9 which generates a simulated sensor view. This simulated sensor view corresponds to an output of a virtual sensing means and is generated by using the mathematical model of the sensing means 2 which gives the approximate position and orientation in the map and information on specification of the sensing means 2. Based on the mathematical model of the sensing means 2, a virtual sensing means output is generated being representative of a scene geometry as it would be physically sensed by a real sensor at the assumed position of the sensor sensing the surrounding of the vehicle represented by the information of the map data. Thus, the virtual sensing output corresponds to a simplified version of the real sensor measurement with the difference that if the assumed sensor position and orientation with respect to the map data is not correct, some deviations occur. Such deviations mainly are shifts, rotations and distortions of the virtual sensor means output with respect to the sensing means output of the sensing means 2.

The virtual sensing means output and the sensing means output are then supplied to a comparison module 10 where the two outputs are compared with each other. For such comparison, there are available a plurality of state of the art data comparison techniques. For example, a comparison can be performed by using feature matching and correspondence search techniques. As an example, a Hough transfer and feature correspondence search process may be mentioned. Alternatively, a statistical estimation can be performed as it is for example known from a random sample consensus method (RANSAC) which is an iterative method to estimate parameters of a mathematical model from a set of data which contains outliers.

With the comparison, a measure ("degree of fit") is obtained for the fit of the two outputs. In a next step, the parameters of the mathematical model of the sensing means 2 are modified and a new virtual sensing means output is generated using the modified parameters. The modification of parameters is carried out only if the degree of fit does not reach a predetermined threshold. By the modification the assumed position and/or orientation of the sensing means 2 in the map is varied. Comparison of the virtual sensing means output and the sensing means output is then repeated. The modification of the parameters and the comparison of the virtual sensing output generated on the basis of the modified parameters is repeated until a good quality of fit between the virtual sensing means output and the sensing means output is achieved. Of course, a modification of the parameters might not be necessary if already in the first comparison the degree of fit fulfills the requirements as set in advance. Thus, by modifying and repeating the comparison, an optimization process for the parameters is performed. At the end of such optimization process, a parameter set is determined that leads to the best comparison results between the virtual sensing means output and the sensing means output. This parameter set is then used for improving the estimation of the vehicle's position and orientation since the relative position and orientation of the sensor with respect to the vehicle 1 is assumed to be known. The relative position and orientation of the sensing means 2 with respect to the vehicle 1 is known in advance, since the mounting position of the sensing means 2 only has to be determined once when a new vehicle 1 is designed or a new sensing means 2 is used.

Although the GPS system may deliver an estimation of an absolute position of the vehicle 1 which is better in terms of absolute co-ordinates it is important that for further processing of the information of the map data and the information derived from the sensing means output for prediction purposes in advance driver assistance systems that the information that is derived from the sensing means output has a correct position relative to the map data. For example in case that data with very limited lateral accuracy is used as it may be the case for open street maps it is not necessary to know the absolute correct position of the street and the vehicles detected by the sensing means 2 but it is sufficient to know precisely the relative position of the vehicles with respect to the position of the street or infrastructure element or the like.

By optimizing the parameters of the mathematical model of the sensing means 2 the virtual sensing means output and the sensing means output are aligned and thus information for example about vehicles that are determined from the sensing means output can be positioned correctly in the map and therefore the combination of the information derived from the sensing means 2 and from the map combined to the more detailed representation of the scene which is then the basis for further processing in an advanced driver assistance system. Thus, when a good alignment of map data with data derived from the sensing means is achieved the results can be used to support and improve ADAS functions. The alignment of positions of traffic participants with the map allows for an improved prediction of other traffic participants trajectories and consequently to improve warning, risk evaluation for the ego-path and path planning capabilities of the systems of the ego-vehicle. The same is of course true for other information that is derived from the sensing means 2 like positioning of traffic signs that may be determined from images taken from camera as sensing means 2.

In addition the alignment allows to correctly (in terms of relative position) add information to the map data itself. As it has already been indicated above traffic lights and traffic signs lane boundaries and pedestrian islands or the like may be determined from an image taken by a camera sensing means 2. After alignment of the sensing means output with the map, such information can be added to the map data if not already present. But even if such information is already present in the original map data the alignment enables to check if the infrastructure element that is determined from the sensing means output is already present and consistent with the local map data around the vehicle. Even a correction of already existent infrastructure items is possible. The improved map data is then preferably stored in the vehicle or even in a distant data base so that the improved map data is then available also for other traffic participants.

The comparison between the virtual sensing means output and the sensing means output may even deliver information about objects that occlude some parts of the traffic scene. This regards in particular information on buildings which is regularly missing in map data. But by means of the sensing means 2 such buildings of course are sensed and thus provide information as such objects hide areas behind the object. When an alignment between the map and the sensing means output is achieved it can thus be evaluated where the assumed road structure of the map matches with the sensed road structure. From the sensing means output it can be determined by comparing with the virtual sensing means output which parts are covered by occluding items like trees, buildings or other traffic participants. Such occluding items can then be included in a scene representation which forms the basis for further processing in an ADAS system.

Figure 3:
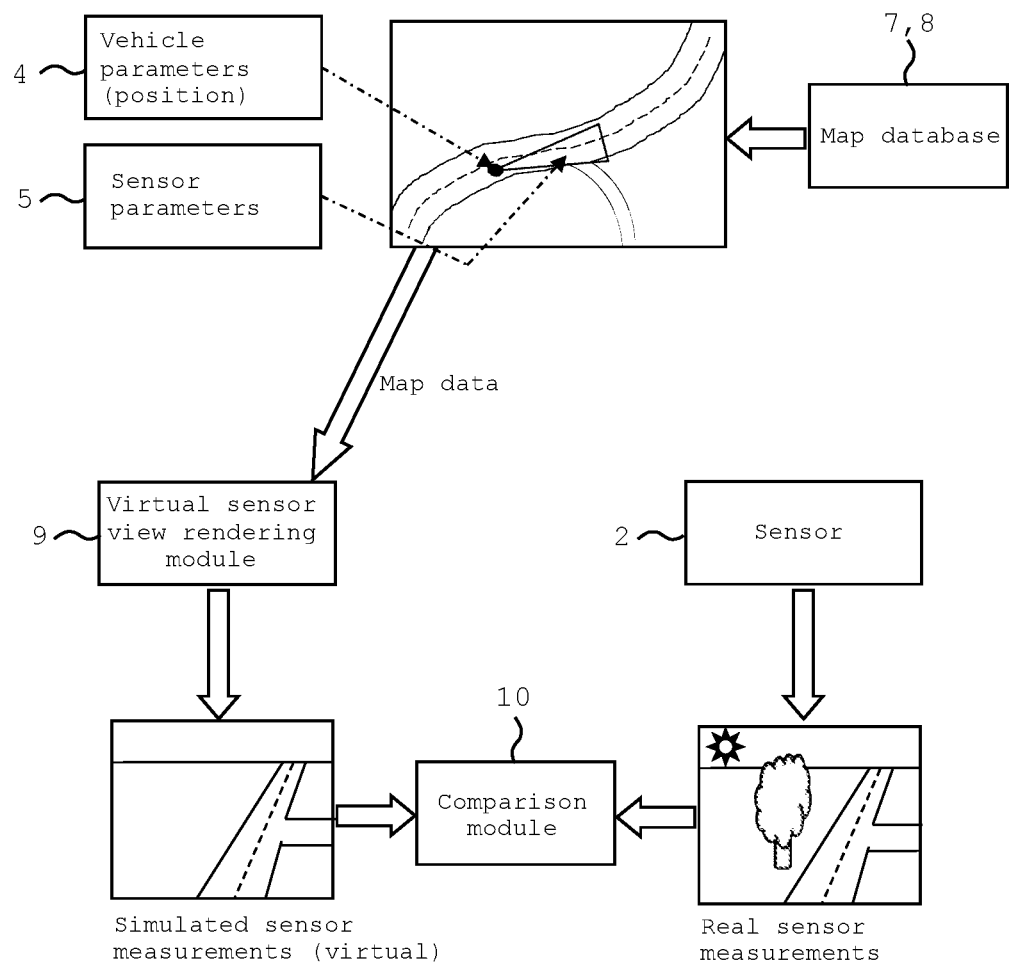
FIG. 3 is an illustration for explanation of the method steps.

FIG. 3 illustrates once more the functioning of the invention. Based on an assumed position of the vehicle 1 and thus of a sensing means 2, and also based on map data which is obtained online or from a storage mounted in the vehicle, a virtual sensor measurement is generated. Additionally a real sensing means measurement is made and both measurement results are compared.

Figure 4:
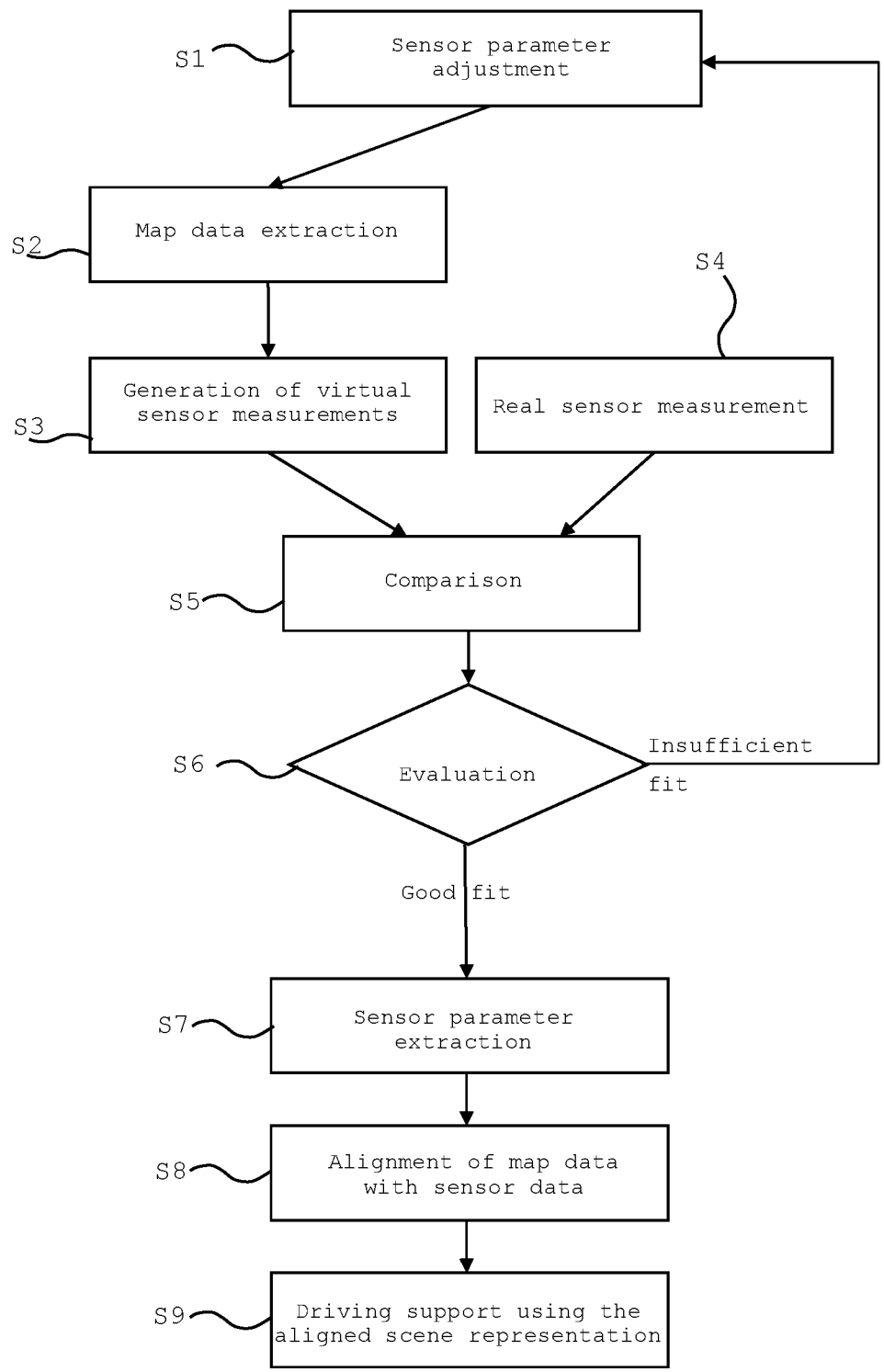
FIG. 4 is a simplified flow chart for explanation of the inventive method.

The process flow of the proposed method is shown in FIG. 4. The system starts with approximate ego-vehicle position and orientation parameters, e.g. as extrapolated from the past measurements (e.g. using odometry or ego-motion estimation means), or from other data sources like GPS. These are combined with the information of the relative position and orientation of the sensor as mounted on the vehicle, and fed into the mathematical model of the sensor device, so that we approximately know the position and orientation of the sensor device with respect to the map data. Thus in step S1 starting parameters for the mathematical sensor model are adjusted.

Based on the sensor position and orientation, the map database is accessed and the necessary infrastructure data in the proximity of the vehicle is retrieved (step S2). This is then used in combination with the assumed sensing means position and orientation to generate a virtual sensing means measurement which simulates the vehicle surroundings as they would appear if taken from the sensor device. In case of a camera sensor, this step generates a 3D view of the road ahead of the camera, e.g. the road surface, the road and lane lines, and so on (step S3).

In addition, a real sensor measurement of the vehicle surroundings is made using the real sensor device (step S4). In the next step, the real and the virtual sensor measurements are compared, and a value for the degree of fit between the two measurements is calculated (Step S5).

Depending on this value (step S6), the position and estimation of the sensor device are systematically varied by modifying the parameters of the mathematical sensor model, and the virtual sensor measurement generation and comparison steps (S3, S4, S5) are repeated until a termination criterion has been reached. The termination criterion is defined in a threshold for the degree of fit. The parameters of the best fitting sensor position and estimation are then selected (step S7).

Based on the best fitting sensor position and estimation, the position and orientation of the vehicle 1 with respect to the map coordinates is re-estimated. The process is then repeated for every new real sensor measurement.

The driving assistance system is then provided with the combined information (steps S8, S9)

In another embodiment of the invention, the process as described above is applied to a system with more than one sensor. In this case, the virtual sensor view has to be generated for each of the sensor, and each sensor contributes to the re-estimation of the position and orientation of the vehicle with respect to the map coordinates.

The invention claimed is:

1. A method for improving prediction results of an advanced driver assistance system of a vehicle, the vehicle being mounted with a sensing means for sensing a surrounding of the vehicle, the method comprising the steps of:
obtaining map data including information about at least a road geometry in a proximity of the vehicle;
assigning a position and orientation in the map to the sensing means on the basis of data including an absolute position and orientation of the vehicle provided by a positioning system, the assigning performed by determining a position and orientation of the vehicle in the map and using a mathematical model of the sensing means,
the mathematical model of the sensing means including parameters that describe a position and orientation of the sensing means relative to a fixed position and orientation of the positioning system of the vehicle, and
the mathematical model further including parameters that describe characteristics of the sensing means;
generating a virtual sensing means output that corresponds to an output of the sensing means if the sensing means sensed the scene defined by the information included in the map data from the assigned position and with the assigned orientation, wherein the generation is based on the mathematical model including the parameters describing characteristics of the sensing means and based on the assigned position and with the assigned orientation;
sensing the surrounding of the vehicle and generating a sensing means output;
comparing the sensing means output and the virtual sensing means output;
modifying the parameters of the mathematical model,
performing an optimization process including repeating the steps of generating the virtual sensing means output using the modified parameters, comparing it with the sensing means output and modifying the parameters of the mathematical model, until a predetermined degree of fit between the virtual sensing means output based on the modified parameters and the sensing means output is achieved;
combining the map data with information derived from the sensing means output and aligned with the map data using the modified parameters to generate combined information on the surrounding of the vehicle; and
outputting the combined information for further processing in the advanced driver assistance system for improving prediction results by aligning the map information and the sensing means output, wherein
combining the map data with information derived from the sensing means output comprises determining infrastructure elements from the sensing means output using the modified parameters and adding information on the determined infrastructure elements to the map data to generate the combined information on the surrounding of the vehicle; and
after a predetermined degree of fit between the virtual sensing means output and the sensing means output is achieved,
extracting, by comparing the virtual sensing means output with the sensing means output, positions of possible occluding items in the sensed environment by determining which areas of the sensing means output are compatible with a road structure assumed from the map data, and
including the positions of the occluding items in a scene representation for further processing by the advanced driver assistance system.

2. The method according to claim 1, wherein
a 3D rendering image is generated as the virtual sensing means output, wherein the sensing means comprises an image sensor.

3. The method according to claim 1, wherein
the sensing means output is generated by a laser scanner, a LIDAR sensor or a radar sensor.

4. The method according to claim 1, wherein
an improved position of the vehicle in the map is determined taking into account the mathematical model with the modified parameters for which the predetermined degree of fit is achieved.

5. The method according to claim 1, wherein the steps of
sensing the surrounding of the vehicle and generating a sensing means output,
comparing the sensing means output and the virtual sensing means output,
modifying repeatedly the parameters of the mathematical model, generating the virtual sensing means output and comparing it with the sensing means output until the predetermined degree of fit between the virtual sensing means output based on the modified parameters and the sensing means output is achieved, and combining map data with information derived from the sensing means output to generate combined information on the surrounding of the vehicle are performed for each of a plurality of sensing means.

6. The method according to claim 5, wherein an improved position of the vehicle in the map is determined taking into account the mathematical models with the modified parameters for which the predetermined degree of fit is achieved for each of the sensing means.

7. A vehicle comprising a sensing means, an advanced driver assistance system and a data processing unit configured to perform the method according to claim 1.

8. A method for improving prediction results of an advanced driver assistance system of a vehicle, the vehicle being mounted with a sensing means including a camera for sensing a surrounding of the vehicle, the method comprising the steps of:

obtaining map data including information about at least a road geometry in a proximity of the vehicle;

assigning a position and orientation in the map to the sensing means on the basis of data including an absolute position and orientation of the vehicle provided by a positioning system, the assigning performed by determining a position and orientation of the vehicle in the map and using a mathematical model of the sensing means, the mathematical model of the sensing means including parameters that describe a position and orientation of the sensing means relative to a fixed position and orientation of the positioning system of the vehicle, and the mathematical model further including parameters that describe characteristics of the sensing means, the characteristics of the sensing means including at least one of an aperture, a sensing range and a focal length;

generating a virtual sensing means output that corresponds to an output of the sensing means if the sensing means sensed the scene defined by the information included in the map data from the assigned position and with the assigned orientation, wherein the generation is based on the mathematical model including the parameters describing characteristics of the sensing means and based on the assigned position and with the assigned orientation;

sensing the surrounding of the vehicle and generating a sensing means output;

comparing the sensing means output and the virtual sensing means output;

modifying the parameters of the mathematical model, performing an optimization process including repeating the steps of generating the virtual sensing means output using the modified parameters, comparing it with the sensing means output and modifying the parameters of the mathematical model, until a predetermined degree of fit between the virtual sensing means output based on the modified parameters and the sensing means output is achieved;

combining the map data with information derived from the sensing means output and aligned with the map data using the modified parameters to generate combined information on the surrounding of the vehicle; and outputting the combined information for further processing in the advanced driver assistance system for improving prediction results by aligning the map information and the sensing means output, wherein combining the map data with information derived from the sensing means output comprises determining infrastructure elements from the sensing means output using the modified parameters and adding information on the determined infrastructure elements to the map data to generate the combined information on the surrounding of the vehicle; and after a predetermined degree of fit between the virtual sensing means output and the sensing means output is achieved, extracting by comparing with the virtual sensing means output from the sensing means output, positions of possible occluding items in the sensed environment by determining which areas of the sensing means output are compatible with a road structure assumed from the map data, and including the positions of the occluding items in a scene representation for further processing by the advanced driver assistance system.

* * * * *